(12) United States Patent
Senda

(10) Patent No.: US 9,059,709 B2
(45) Date of Patent: Jun. 16, 2015

(54) GATE DRIVE CIRCUIT FOR TRANSISTOR

(71) Applicant: DENSO CORPORATION, Kariya, Aichi-pref. (JP)

(72) Inventor: Yasutaka Senda, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/100,178

(22) Filed: Dec. 9, 2013

(65) Prior Publication Data

US 2014/0203860 A1 Jul. 24, 2014

(30) Foreign Application Priority Data

Jan. 21, 2013 (JP) .................................... 2013-8345

(51) Int. Cl.
*H03K 17/16* (2006.01)
*H03K 17/30* (2006.01)
*H03K 17/082* (2006.01)

(52) U.S. Cl.
CPC ............ *H03K 17/30* (2013.01); *H03K 17/0828* (2013.01)

(58) Field of Classification Search
CPC .......... H03K 17/04126; H03K 17/063; H03K 2217/0036; H03K 17/601; H03K 17/0826
USPC ......... 327/108–112, 379, 381, 419, 427, 434, 327/436
See application file for complete search history.

(56) References Cited

U.S. PATENT DOCUMENTS

| | | |
|---|---|---|
| 2008/0004773 A1 | 1/2008 | Maeda |
| 2009/0066402 A1 | 3/2009 | Hiyama |
| 2010/0176783 A1 | 7/2010 | Tagome |
| 2012/0126859 A1 | 5/2012 | Kawamoto et al. |
| 2012/0242376 A1 | 9/2012 | Ose et al. |

FOREIGN PATENT DOCUMENTS

| | | |
|---|---|---|
| JP | H11-163698 A | 6/1999 |
| JP | 2000-014127 A | 1/2000 |
| JP | 2008-147923 A | 6/2008 |
| JP | 2009-087293 A | 4/2009 |
| JP | 2012-100489 A | 5/2012 |
| JP | 2012-161123 A | 8/2012 |
| JP | 2012-161184 A | 8/2012 |

OTHER PUBLICATIONS

Office Action mailed Feb. 24, 2015 issued in corresponding JP patent application No. 2013-008345 (and English translation).

*Primary Examiner* — Lincoln Donovan
*Assistant Examiner* — Diana J Cheng
(74) *Attorney, Agent, or Firm* — Posz Law Group, PLC

(57) ABSTRACT

In a gate drive circuit, a gate voltage limiting circuit limits a gate voltage equal to or lower than a first limiting voltage in a first period, and limits the gate voltage equal to or lower than a second limiting voltage in a second period. A gate voltage generation circuit generates a drive voltage having a first set value, which is determined to operate the transistor in an active region, in the first period, and generates the drive voltage having a second set value, which is determined based on a gate withstand voltage of the transistor and loss in an on operation of the transistor in a saturated region, in the second period. The first limiting voltage is higher than the first set value by a predetermined value. The second limiting voltage is higher than the second set value by a predetermined value.

7 Claims, 9 Drawing Sheets

GATE DRIVE CIRCUIT FOR TRANSISTOR

CROSS REFERENCE TO RELATED APPLICATION

This application is based on Japanese Patent Application No. 2013-8345 filed on Jan. 21, 2013, the disclosure of which is incorporated herein by reference.

TECHNICAL FIELD

The present disclosure relates to a gate drive circuit for a transistor.

BACKGROUND

In a case where a short fault has occurred in one of an upper arm transistor and a lower arm transistor, which constitute a bridge circuit, when the other of the upper arm transistor and the lower arm transistor, which has no fault, is turned on, a short circuit current flows in these transistors, resulting in a secondary fault. A similar issue arises also in a case where an output terminal to be connected to a load is short-circuit to a power source line or in a case where a winding of a motor as a load has a short fault.

For example, the transistor is an insulated gate bipolar transistor (IGBT). In this case, when an on command is applied to a gate drive circuit, a gate voltage that is slightly higher than a threshold voltage is applied to a gate of the IGBT to operate the IGBT in an active region. A short fault can be detected based on a current detected when the IGBT is operated in the active region. When it is determined that there is no short fault, the gate voltage having a sufficient value is applied to the gate of the IGBT to operate the IGBT in a saturated region. Such a technology is, for example, disclosed in JP 2009-071956 A, which corresponds to US 2009/0066402 A1.

In such a structure, when the gate voltage is excessively high and exceeds a gate withstand voltage $V_{GES}$, the IGBT is likely to be broken or the life time of the IGBT is likely to be shortened. In a conventional gate drive circuit, therefore, a clamp circuit is connected to the gate of the IGBT to protect the IGBT from a transitional increase of the gate voltage. The clamp circuit clamps (limits) the gate voltage to a predetermined voltage.

To protect the IGBT from an overcurrent condition due to a short fault or the like, that is, to perform a short circuit protection, it is necessary to consider the following points.

When the IGBT is shut off from the overcurrent condition by reducing the current, a surge (S) occurs according to an L component (inductance) of a current path through which a short circuit current flows and a change ratio (di/dt) of the short circuit current (i.e., $S=-L\times(di/dt)$). When the surge exceeds the withstand voltage of the IGBT, there is a possibility that the IGBT is broken. Therefore, when the IGBT is shut off from the overcurrent condition by reducing the current, it is necessary to shut off the IGBT so that the short circuit current does not drastically change, and the surge does not exceed the withstand voltage of the IGBT.

In an abnormal time, such as in the above-described short fault condition, a collector voltage of the IGBT changes. Therefore, electric charge is injected to a gate capacitance through a parasitic capacitance (mirror capacitance) between the collector and the gate of the IGBT. That is, a mirror current flows. As a result, the gate voltage rises. With this, an on state of the IGBT is further deepened, that is, an on-state resistance of the IGBT is further lowered, resulting in an increase of the collector current (short circuit current). Therefore, a path for drawing the mirror circuit through the clamp circuit or the like is required.

However, the path of the short circuit current is different depending on the type of fault, as well as the L component will be different depending on the path. Therefore, the change ratio of the short circuit current is different depending on the type of fault, and the time required to determine whether the short circuit current is in an overcurrent condition is different.

Therefore, in the above-described technology, the following drawbacks will arise. For example, in a case where the L component of the current path is relatively large, even if the short fault has occurred, it is determined as a normal condition since the short circuit current does not reach the overcurrent after a predetermined period of time elapses. Thereafter, when the limiting of the gate voltage is cancelled and the sufficiently high gate voltage is applied to the gate, the current reaches the overcurrent. In this case, since there is no path for drawing the mirror current, the gate voltage further rises. Further, the short circuit current increases, and the shutting off of the IGBT is delayed. Moreover, the IGBT will be broken.

When the overcurrent has been determined in the state where the gate voltage is high, and when the gate voltage is drastically reduced so as to solve the overcurrent state, the collector current of the IGBT is rapidly limited. In this case, the collector current is reduced at a very high change ratio and a high surge voltage is generated. To solve this issue, it is considered to operate the clamp circuit all of the time in an on period of the IGBT. In this case, however, a period of time to flow the current through the clamp circuit is unnecessarily long, resulting in an increase in consumption current.

SUMMARY

It is an object of the present disclosure to provide a gate drive circuit that is capable of performing a short circuit protection in an entire on period of a transistor while reducing an increase in consumption current.

According to a first aspect of the present disclosure, a gate drive circuit for a target transistor includes a drive voltage generation circuit, a gate on-drive circuit, and a gate voltage limiting circuit. The drive voltage generation circuit generates a drive voltage to drive the target transistor. The gate on-drive circuit turns on a voltage supply path from an output terminal of the drive voltage generation circuit to a gate terminal of the target transistor according to an on command, and turns off the voltage supply path according to an off command. The gate voltage limiting circuit limits a gate voltage of the target transistor equal to or lower than a first limiting voltage, irrespective of a voltage applied to the target transistor, in a first period from a time the on command is generated to a time determination whether a current flowing in the target transistor exceeds a fault determination reference value finishes. The gate voltage limiting circuit limits the gate voltage equal to or lower than a second limiting voltage that is higher than the first limiting voltage, irrespective of the voltage applied to the transistor, in a second period after the first period. The first limiting voltage is determined to a value so that a current flowing in the target transistor is kept equal to or lower than a maximum allowable current. In the second period, the drive voltage generation circuit generates the drive voltage having a second set value that is determined based on a gate withstand voltage of the target transistor and loss of the target transistor when the target transistor is operated in a saturated region. The second limiting voltage is set to a value higher than the second set value of the drive voltage by a predetermined value.

In the above structure, in a case where a short fault has occurred in a transistor constituting a bridge circuit with the target transistor, an output terminal connecting to a load, or the load, the short fault can be determined while limiting a current flowing in the target transistor equal to or lower than a maximum allowable current. Further, when the short fault has occurred, an increase in the gate voltage according to a mirror current is restricted by a limiting operation of the gate voltage limiting circuit.

In the first period, the gate voltage is limited equal to or lower than the first limiting voltage. In the second period, the gate voltage is limited equal to or lower than the second limiting voltage. Therefore, the increase in the gate voltage due to the mirror current can be restricted, irrespective of the value of the inductance of the path of the short circuit current. As a result, an increase in the short circuit current can be restricted.

In the second period, the drive voltage generation circuit generates the drive voltage having the second set value. Therefore, in a normal operation time, the value of the gate voltage in the second period is the second set value at most. On the other hand, in the second period, the gate voltage limiting circuit limits the gate voltage of the target transistor equal to or lower than the second limiting voltage that is higher than the second set value by a predetermined value. Therefore, in the second period of the normal operation time, the gate voltage limiting circuit does not perform the limiting operation. As such, in an on period of the target transistor, the short circuit protection can be performed while reducing the increase in consumption current to a lower value, as compared with a structure in which the gate voltage limiting circuit is always operated in the on period of the target transistor.

According to a second aspect of the present disclosure, in the gate drive circuit according to the first aspect, the drive voltage generation circuit generates the drive voltage having a first set value that is higher than a threshold voltage of the target transistor and lower than the second set value in the first period. The first limiting voltage is set to a value higher than the first set value of the drive voltage by a predetermined value.

In this structure, in the normal operation time, the value of the gate voltage of the first period is the first set value at most. On the other hand, the gate voltage limiting circuit limits the gate voltage of the target transistor equal to or lower than the first limiting voltage that is higher than the first set value by a predetermined value. Therefore, in the normal operation time, the gate voltage limiting circuit does not perform the limiting operation. Accordingly, the increase in consumption current can be further reduced.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

Hereinafter, exemplary embodiments of a gate drive circuit will be described with reference to the drawings. In the following embodiments, like parts will be designated with like reference numbers, and descriptions thereof will not be repeated.

First Embodiment

A first embodiment of the present disclosure will be described with reference to FIGS. 1 to 8.

Figure 1:
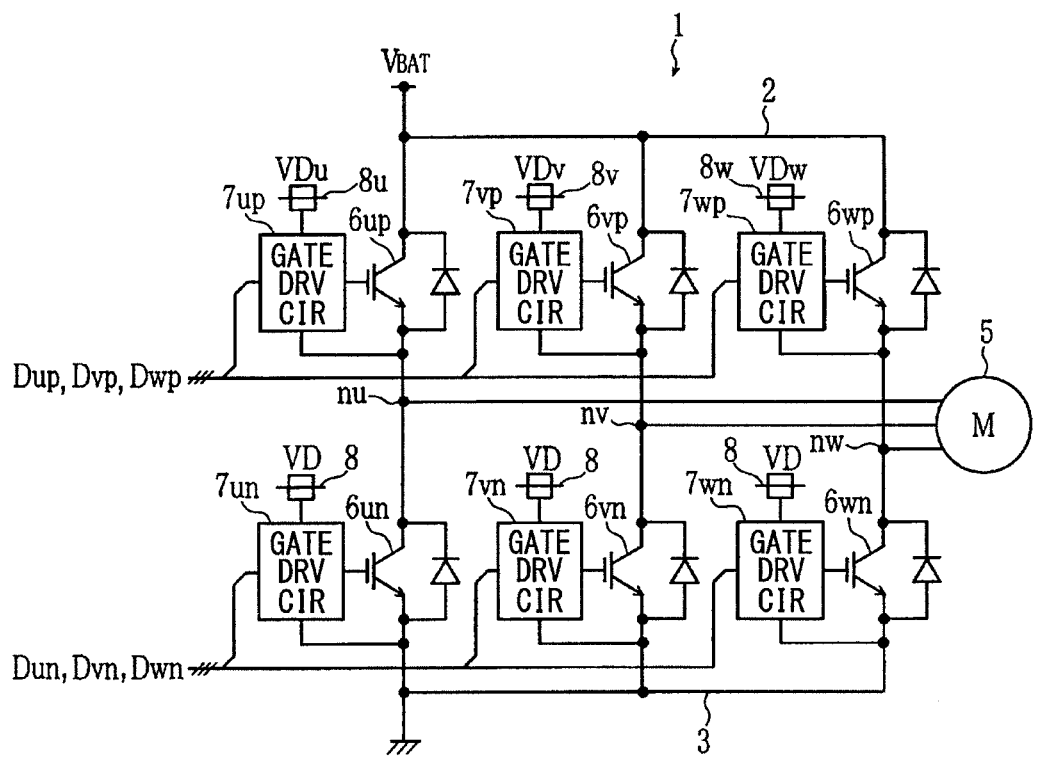
FIG. 1 is a schematic diagram of an inverter to which a gate drive circuit according to a first embodiment is employed.

Referring to FIG. 1, an inverter 1 is supplied with a battery voltage $V_{BAT}$ from an in-vehicle battery through power source lines 2, 3. The inverter 1 outputs an alternating-current (AC) voltage to a brushless direct-current (DC) motor 5 based on pulse-width modulation (PWM) control signals Dup, Dvp, Dwp, Dun, Dvn, Dwn. The PWM control signals Dup, Dvp, Dwp, Dun, Dvn, Dwn are provided from a control unit 4 (FIG. 2) through a photo-coupler.

Between the power source line 2 and the power source line 3, IGBTs 6up, 6vp, 6wp and IGBTs 6un, 6vn, 6wn are connected to form a bridge circuit with three phases. The IGBTs 6up, 6vp, 6wp constitutes an upper arm of the bridge circuit, and the IGBTs 6un, 6vn, 6wn constitutes a lower arm of the bridge circuit. A freewheel diode is connected in parallel with each of the IGBTs 6up to 6wn. Each of the IGBTs 6up to 6wn includes an IGBT for sensing a current, and is constructed as a separate module. The IGBTs 6up to 6wn are, respectively, driven by gate drive circuits 7up to 7wn, which are constructed as separate ICs.

The gate drive circuits 7up, 7vp, 7wp of the upper arm are, respectively, supplied with power source voltages $V_{Du}$, $V_{Dv}$, $V_{Dw}$ through power supply lines 8u, 8v, 8w which have output nodes nu, nv, nw as a reference voltage. The gate drive circuits 7un, 7vn, 7wn of the lower arm are, respectively, supplied with a power source voltage VD through a power supply line 8 that has a ground potential as a reference potential.

The gate drive circuits 7up to 7wn have the same structure. Therefore, the gate drive circuits 7up to 7wn are hereinafter generalized as a gate drive circuit 7 for the sake of explanation. Likewise, the IGBTs 6up to 6wn are hereinafter simply referred to as the IGBT 6. Further, the PWM controls signals Dup to Dwn are hereinafter simply referred to as the control signal D. The IGBT 6 corresponds to a transistor (i.e., target transistor). Hereinafter, the gate drive circuit 7 will be described in detail.

Figure 2:
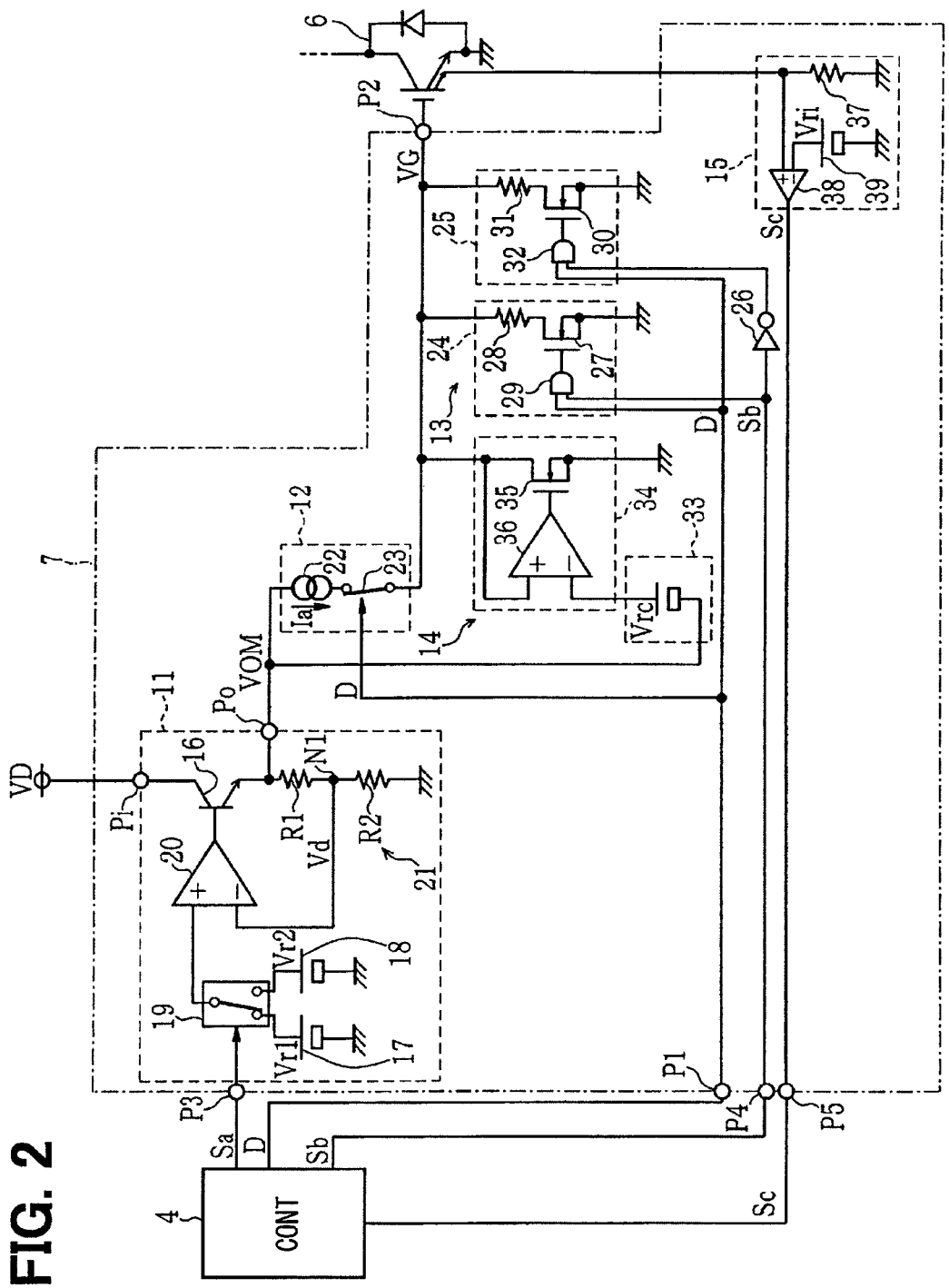
FIG. 2 is a diagram of the gate drive circuit according to the first embodiment.

As shown in FIG. 2, the gate drive circuit 7 includes a gate voltage generation circuit 11, a gate-on drive circuit 12, a gate off-drive circuit 13, a gate voltage limiting circuit 14 and an overcurrent determination circuit 15. The gate voltage generation circuit 11 corresponds to a drive voltage generation circuit.

The IC of the gate drive circuit 7 has terminals P1 to P5. The terminal P1 serves as an input terminal of the control signal D. The terminal P2 serves as an output terminal of a gate voltage VG. When the control signal D is at a high level (H-level), the gate drive circuit 7 is in a condition of being applied with an off command. When the control signal D is at a low level (L-level), the gate drive circuit 7 is in a condition of being applied with an on command.

The terminal P3 serves as an input terminal of a voltage switching signal Sa. The terminal P4 serves as an input terminal of an abnormality determination signal Sb. The terminal P5 serves as an output terminal of an overcurrent determination signal Sc.

The gate voltage generation circuit 11 is a series regulator-type power supply circuit that reduces the power source voltage VD, which is inputted through an input terminal Pi, to a predetermined voltage, and output the reduced voltage from an output terminal Po. The voltage outputted from the output terminal Po of the gate voltage generation circuit 11 is a drive voltage VOM to drive (i.e., on-drive) the IGBT 6.

The gate voltage generation circuit 11 has a function of switching a value of the drive voltage VOM based on the voltage switching signal Sa provided from the control unit 4. In particular, when the voltage switching signal Sa is at a high level (H-level), the gate voltage generation circuit 11 switches the value of the drive voltage VOM to a first set value VOM1. When the voltage switching signal Sa is at a low level (L-level), the gate voltage generation circuit 11 switches the value of the drive voltage VOM to a second set value VOM2.

The second set value VOM2 is determined based on a gate withstand voltage of the IGBT 6 and loss of the IGBT when the IGBT 6 is in a fully on state (i.e., in an on-operation in a saturated region). In particular, the second set value VOM2 is set to a value that can satisfy the reliability of a gate oxide film of the IGBT 6 and can reduce loss in the fully on state of the IGBT 6 to a level lower than a predetermined level.

The first set value VOM1 is higher than a threshold voltage and a mirror voltage of the IGBT 6, but lower than the second set voltage VOM2. That is, the first set value VOM1 is set to a value in a range where the IGBT 6 can be on-operated in an active region.

The gate voltage generation circuit 11 includes a transistor 16, reference voltage generation parts 17, 18, a switch 19, an operation amplifier 20 and a voltage detection circuit 21. The transistor 16 is an NPN bipolar transistor. The transistor 16 is connected between the input terminal Pi and the output terminal Po. The reference voltage generation parts 17, 18 are, for example, provided by band gap reference circuits.

The reference voltage generation part 17 generates a first reference voltage Vr1 for instructing the first set voltage VOM1 that is a first target value of the drive voltage VOM. The reference voltage generation part 18 generates a second reference voltage Vr2 for instructing the second set voltage VOM2 that is a second target value of the drive voltage VOM.

The first reference voltage Vr1 generated from the reference voltage generation part 17 is applied to a first switching terminal of the switch 19. The second reference voltage Vr2 generated from the reference voltage generation part 18 is applied to a second switching terminal of the switch 19. A common terminal of the switch 19 is connected to a non-inverted input terminal of the operation amplifier 20.

The switch 19 is controlled according to the level of the voltage switching signal Sa provided from the control unit 4.

In particular, when the voltage switching signal Sa is at the high-level, the switch 19 is operated to electrically connect, that is, turns on between the first switching terminal and the common terminal. Therefore, the first reference voltage Vr1 is applied to the non-inverted input terminal of the operation amplifier 20.

When the voltage switching signal Sa is at the low-level, the switch 19 is operated to electrically connect between the second switching terminal and the common terminal. Therefore, the second reference voltage Vf2 is applied to the non-inverted input terminal of the operation amplifier 20.

The voltage detection circuit 21 is provided by a series circuit of a resistor R1 and a resistor R2. The series circuit is connected between the output terminal Po and a ground line. A voltage at a common connecting point N1 between the resistor R1 and the resistor R2 is obtained as a detection voltage Vd. That is, the detection voltage Vd is obtained by dividing the drive voltage VOM by the resistor R1 and the resistor R2. The detection voltage Vd is applied to an inverted input terminal of the operation amplifier 20.

A resistance ratio (division ratio) of the resistor R1 and the resistor R2 is set to a value so that the detection voltage Vd coincides with the first reference voltage Vr1 when the drive voltage VOM is at the first set value VOM1, and the detection voltage Vd coincides with the second reference voltage Vr2 when the drive voltage VOM is at the second set value VOM2.

The operation amplifier 20 generates an error amplification signal according to a difference between the detection voltage Vd applied to and the first reference voltage Vr1 or the second reference voltage Vr2, and provides the error amplification signal to a base of the transistor 16. The operation of the transistor 16 is controlled by the error amplification signal.

The gate on-drive circuit 12 includes a constant current source 22 and a switch 23. The constant current source 22 and the switch 23 are connected in series to each other, between the output terminal Po of the gate voltage generation circuit 11 and the gate of the IGBT 6.

The constant current source 22 outputs a constant current Ia from the output terminal Po toward the gate of the IGBT 6. The switch 23 is controlled according to the control signal D provided from the control unit 4. That is, the switch 23 is turned on and off (e.g., opened and closed) according to the control signal D. In particular, when the control signal D is at the high level, the switch 23 is turned off. When the control signal D is at the low level, the switch 23 is turned on.

In the above-described structure, when the control signal D is at the low level, that is, when the on command is inputted, the gate on-drive circuit 12 electrically connects, that is, turns on a voltage supply path from the output terminal Po of the gate voltage generation circuit 11 to the gate terminal of the IGBT 6. With this, the gate voltage VG increases as a gate capacitance is charged by the constant current Ia outputted from the constant current source 22, and thus the IGBT 6 is turned on.

That is, the gate drive circuit 17 turns on the IGBT 6 by driving the gate of the IGBT 6 with a constant current (i.e., constant current drive). In this case, the gate voltage VG of the IGBT 6 increases up to the drive voltage VOM. When the control signal D is at the high level, that is, when the off command is inputted, the gate on-drive circuit 12 turns off the voltage supply path.

The gate off-drive circuit 13 includes a normal-time off circuit 24, an abnormal-time off circuit 25, and a NOT circuit 26. The normal-time off circuit 24 includes a transistor 27, a resistor 28 and an AND circuit 29. The transistor 27 is an N-channel MOS transistor. A drain of the transistor 27 is connected to the gate of the IGBT 6 through the resistor 28. A source of the transistor 27 is connected to the ground. A gate of the transistor 27 is applied with an output signal of the AND circuit 29. The control signal D is applied to an input terminal of the AND circuit 29. The abnormality determination signal Sb is applied to the other input terminal of the AND circuit 29.

The abnormal-time off circuit 25 includes a transistor 30, a resistor 31 and an AND circuit 32. The transistor 30 is an N-channel MOS transistor. A drain of the transistor 30 is connected to the gate of the IGBT through the resistor 31. A source of the transistor 30 is connected to the ground. A gate of the transistor 30 is applied with an output signal of the AND circuit 32. The control signal D is applied to an input terminal of the AND circuit 32. The abnormality determination signal Sb is applied to the other input terminal of the AND circuit 32 after being inverted through the NOT circuit 26. A resistance value of the resistor 31 is higher than a resistance value of the resistor 28 of the normal-time off circuit 24.

The abnormality determination signal Sb is provided from the control unit 4. The level of the abnormality determination signal Sb changes depending on whether an abnormality that an overcurrent flows in the IGBT 6 has occurred. In particular, the abnormality determination signal Sb is at a high level (H-level) in the normal time where there is no abnormality. The abnormality determination signal Sb is at a low level (L-level) in an abnormal time where there is an abnormality.

In the above-described structure, when the control signal D is at the high level and the abnormality determination signal Sb is at the high level, that is, when the off command is inputted in the normal time, a conduction path from the gate of the IGBT 6 to the ground line (i.e., emitter of the IGBT 6) through the normal-time off circuit 24 is formed. As such, the gate capacitance is discharged by a time constant that is determined by the resistor 28 having the relatively small resistance value. Accordingly, when the off command is inputted in the normal time, the gate voltage VG is relatively drastically reduced, and the IGBT 6 is drastically turned off. The conduction path formed from the gate of the IGBT 6 to the ground line through the normal-time off circuit 24 in this case will be also referred to as a first path.

When the control signal D is at the high level and the abnormality determination signal Sb is at the low level, that is, when the off command is inputted in the abnormal time, a conduction path from the gate of the IGBT 6 to the ground line (i.e., emitter of the IGBT 6) through the abnormal-time off circuit 25 is formed. As such, the gate capacitance is discharged by a time constant that is determined by the resistor 31 having the relatively large resistance value. Accordingly, when the off command is inputted in the abnormal time, the gate voltage VG is relatively moderately reduced, and the IGBT 6 is moderately turned off. The conduction path formed from the gate of the IGBT 6 to the ground line through the abnormal-time off circuit 25 in this case will be also referred to as a second path.

The gate voltage limiting circuit 14 includes a clamp circuit reference voltage generation part 33 and a gate clamp circuit 34. The clamp circuit reference voltage generation part 33 corresponds to a limiting voltage generation circuit. The clamp circuit reference voltage generation part 33 is provided by a constant voltage circuit that has the drive voltage VOM as a reference, that is, is applied with the drive voltage as a reference.

The clamp circuit reference voltage generation part 33 generates a reference voltage Vrc obtained by adding a voltage Vα of the constant voltage circuit to the drive voltage VOM (i.e., Vrc=VOM+Vα), and supplies the reference voltage Vrc to the gate clamp circuit 34.

The value of the reference voltage Vrc generated in the above-described manner changes in accordance with the value of the drive voltage VOM. In particular, when the drive voltage VOM has the first set value VOM1, the reference voltage Vrc has a first value that is obtained by adding the voltage Vα to the first set value VOM1. When the drive voltage VOM has the second set value VOM2, the reference voltage Vrc has a second value that is obtained by adding the voltage Vα to the second set value VOM2.

The gate clamp circuit 34 includes a transistor 35 and an operation amplifier 36. The transistor 35 corresponds to a voltage limiting transistor. The operation amplifier 36 corresponds to a voltage limiting operation control circuit. The transistor 35 is an N-channel MOS transistor. A drain of the transistor 35 is connected to the gate of the IGBT 6. A source of the transistor 35 is connected to the ground line. A gate of the transistor 35 is applied with an output signal of the operation amplifier 36.

A non-inverted input terminal of the operation amplifier 36 is connected to the gate of the IGBT 6 (drain of the transistor 35). An inverted input terminal of the operation amplifier 36 is applied with the reference voltage Vrc.

In the above-described structure, when the gate voltage VG of the IGBT 6 exceeds the reference voltage Vrc, the operation amplifier 36 turns on the transistor 35. When the gate voltage VG is lower than the reference voltage Vrc, the operation amplifier 36 turns off the transistor 35. Namely, in the above-described structure, the driving of the transistor 35 is controlled by an error amplification operation of the operation amplifier 36. The gate voltage VG of the IGBT 6 is limited (clamped) equal to or lower than a predetermined limiting voltage (clamping voltage), irrespective of an application voltage to the IGBT 6.

The above-described limiting voltage is switched between two levels according to the reference voltage Vrc provided from the clamp circuit reference voltage generation part 33. In particular, when the reference voltage Vrc has the first value obtained by adding the voltage Vα to the first set value VOM1, the limiting voltage has a first limiting value VCL1 (i.e., VCL1=VOM1+Vα). When the reference voltage Vrc has the second value obtained by adding the voltage Vα to the second set value VOM2, the limiting voltage has a second limiting value VCL2 (i.e., VCL2=VOM2+Vα).

The first limiting value VCL1 of the limiting voltage is higher than the first set value VOM1 of the drive voltage VOM by the voltage Va. The first limiting value VCL1 is set to a value so that the current flowing in the IGBT 6 is kept equal to or lower than a maximum allowable current. The maximum allowable current is specific to the IGBT 6. The maximum allowable current is a maximum current that can flow in the IGBT 6 without causing any fault.

The second limiting value VCL2 is higher than the second set value VOM2 of the drive voltage VOM by the voltage Va. The second limiting value VCL2 is higher than the first limiting value VCL1.

It is preferable that the difference between the first set value VOM1 and the first limiting value VCL1 and the difference between the second set value VOM2 and the second limiting value VCL2 are small. That is, it is preferable that the voltage Vα is small. The smaller the voltage Vα is, the lower value the gate voltage VG of the IGBT 6 is clamped on. Therefore, an overcurrent, such as a short circuit current, can be further reduced. In fact, it is necessary to provide the voltage Vα, the first set value VOM1 and the second set value VOM2 with tolerance considering variations of components part in each product.

Therefore, the first set value VOM1, the second set value VOM2 and the voltage Vα are set to smaller values while satisfying the following relationships (1) and (2) and while considering the above-described tolerance:

$$VOM1 < VCL1 \quad (1)$$

$$VOM2 < VCL2 \quad (2)$$

The overcurrent determination circuit 15 determines whether the current flowing in the IGBT 6 exceeds an abnormality determination reference value, and provides an overcurrent determination signal Sc indicating the determination result to the control unit 4. When the current flowing the IGBT 6 does not exceed the abnormality determination reference value, the overcurrent determination signal Sc is at a low level (L-level). When the current flowing in the IGBT 6 exceeds the abnormality determination reference value, the overcurrent determination signal Sc is at a high level (H-level).

The overcurrent determination circuit 15 includes a resistor 37, a comparator 38 and a reference voltage generation part 39. The resistor 37 is connected between an emitter of the IGBT 6 for sensing the current and the ground line. A non-inverted input terminal of the comparator 38 is applied with the voltage at the connecting point between the resistor 37 and the current sensing emitter, that is, a voltage caused as the current flowing in the current sensing emitter flows in the resistor 37 (i.e., a voltage based on the ground potential as a reference).

The reference voltage generation part 39 is constructed of a constant voltage circuit that generates a reference voltage Vri based on the ground potential as a reference. The reference voltage Vri generated by the reference voltage generation part 39 is applied to an inverted input terminal of the comparator 38. An output signal of the comparator 38 is applied to the control unit 4 as the overcurrent detection signal Sc.

Figure 3:
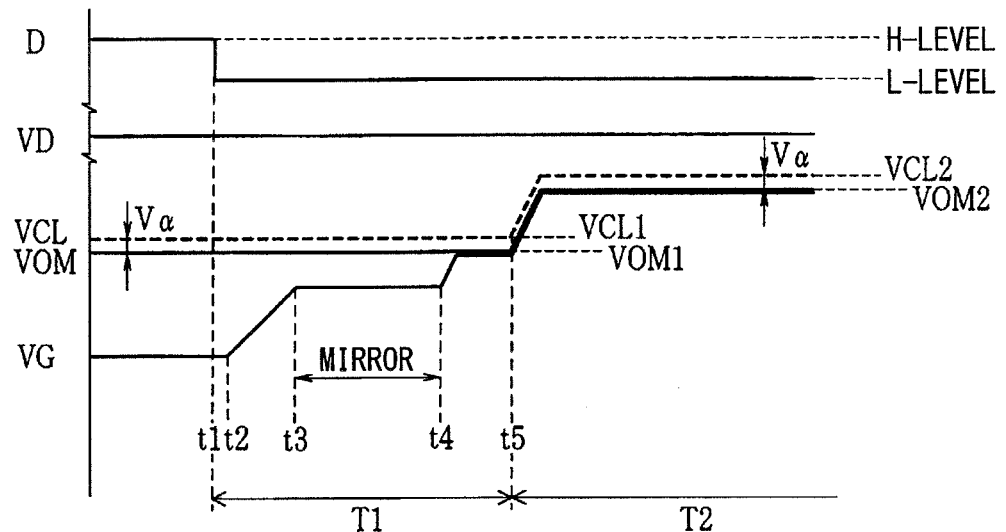
FIG. 3 is a time chart illustrating signals and voltages in a normal time according to the first embodiment.

Next, an operation of the gate drive circuit 7 in the normal time will be described with reference to FIG. 3. In FIG. 3, waveforms of the control signal D, the power source voltage VD, the drive voltage VOM and the gate voltage VG are shown with solid lines. A waveform of the limiting voltage VCL in a clamping operation of the gate clamp circuit 34 is shown with a dashed line.

When the control signal D changes from the high level corresponding to the off command to the low level corresponding to the on command, the switch 23 of the gate on-drive circuit 12 is turned on. Thus, the charging of the gate capacitance begins, and the gate voltage VG begins to rise. In this case, a time delay exists from a time (timing t1) the on command is generated to a time (timing t2) the gate voltage VG begins to rise, due to an operation of the switch 23 or the like. Thereafter, when the gate voltage VG reaches the threshold voltage of the IGBT 6, the IGBT 6 turns on. When the IGBT 6 turns on, a mirror period (from timing t3 to timing t4) where the gate voltage VG is kept at a mirror voltage exists. After the mirror period (mirror region) ends, the gate voltage Vg begins to rise again.

A first period T1 that begins immediately after the on-drive of the IGBT 6 (i.e., the period from the timing t1 to the timing t5) is necessary to perform the short circuit protection, that is, to determine a short fault by limiting the current flowing in the IGBT 6 to a value lower than the maximum allowable current of the IGBT 6, in a case where a short fault has occurred such as in the subject IGBT 6 (e.g., IGBT 6*un*), the IGBT 6 (e.g., IGBT 6*up*) of the other arm that constitutes the bridge circuit with the subject IGBT 6, the output node nx (x:u, v, w) or windings of the brushless DC motor 5.

The control unit 4 determines a short fault based on the overcurrent determination signal Sc provided from the overcurrent determination circuit 15. That is, the control unit 4 determines whether the collector current flowing in the IGBT 6 exceeds the fault determination reference value. The fault determination reference value is set in a range so that the fault determination reference value is greater than a maximum current that flows in the IGBT 6 when there is no short fault, and is smaller than the current (equal to or lower than the maximum allowable current) flowing in the IGBT 6 when there is a short fault.

When the control unit 4 determines that the collector current exceeds the fault determination reference value, the control unit 4 sets the control signal D to the high level and sets the abnormality determination signal Sb to the high level. Therefore, the transistor 30 of the abnormal-time off circuit 25 turns on, and the IGBT 6 is moderately turned off.

In the first period T1, the gate voltage generation circuit 11 is in a state of outputting the drive voltage VOM having the first set value VOM1. Therefore, in the first period T1, the IGBT 6 is operated (on-operated) in the active region. In the first period T1, the gate voltage VG increases up to the first set value VOM1.

Since the drive voltage VOM is set to the first set value VOM1, the limiting voltage VCL has the first limiting value VCL1. Therefore, in the first period T1, even if the IGBT 6 becomes a state (overcurrent state) where an excessive short circuit current can flow due to a short fault or the like, since the gate voltage VG is limited to a value equal to or lower than the first limiting value VCL1, a peak value of the short circuit current (collector current) is reduced.

A second period T2 (after the timing t5) begins when the first period T1 ends and it is determined there is no short fault. In the second period T2, the gate voltage VG having a sufficient value is required to operate the IGBT 6 in the saturated region so as to reduce loss. However, if the gate voltage VG that is higher than the gate withstand voltage $V_{GES}$ is applied to the IGBT 6, it results in a fault.

Therefore, when the second period T2 begins, the gate voltage generation circuit 11 is switched to a state to output the drive voltage VOM having the second set value VOM2. As such, in the second period T2, the gate voltage VG increases to reach the second set value VOM2, and the IGBT 6 is operated (on-operated) in the saturated region.

Since the drive voltage VOM is set to the second set value VOM2, the limiting voltage VCL has the second limiting value VCL2. Therefore, in the second period T2, even if the circuit becomes a state (overcurrent state) where an excessive short circuit current can flow due to a short fault or the like, since the gate voltage VG is limited to a value equal to or lower than the second limiting value VCL2, a peak value of the short circuit current (collector current) is reduced.

Although not illustrated in FIG. 3, when the control signal D changes from the low level corresponding to the on command to the high level corresponding to the off command, the transistor 27 of the normal-time off circuit 24 is turned on, and the IGBT 6 is drastically turned off.

In the above-described structure, the timing to end the first period T1, that is, a switching timing from the first period T1 to the second period T2 needs to be determined based on a value, such as a value of the threshold voltage, a length of the mirror period, specific to the IGBT 6 as a target transistor. The switching timing can be set by the following two methods.

As a first method, the switching timing is set to a timing where a predetermined period elapsed after the time (i.e., timing t1) the control signal D is changed to the low level.

As a second method, a voltage detection circuit is additionally provided to detect the gate voltage VG. The switching timing is set to a timing a predetermined period elapsed after a time a voltage value detected by the voltage detection circuit reaches a predetermined determination value that is higher than a voltage (0 V) of the off time.

In the first method, it is not necessary to additionally use the voltage detection circuit for detecting the gate voltage VG. Therefore, the circuit structure can be simplified. However, it is necessary to set the predetermined period while considering the time delay from the time (timing t1) the on command is generated to the time (timing t2) the gate voltage VG actually begins to rise.

In the second method, it is not necessary to consider the time delay from the time the on command is generated to the time the gate voltage VG actually begins to rise. Therefore, the switching timing can be accurately and suitably set. However, the voltage detection circuit for detecting the gate voltage VG is necessary.

Next, examples of the short circuit paths depending on positions of short faults will be described with reference to FIGS. 4 to 6.

Figure 4:
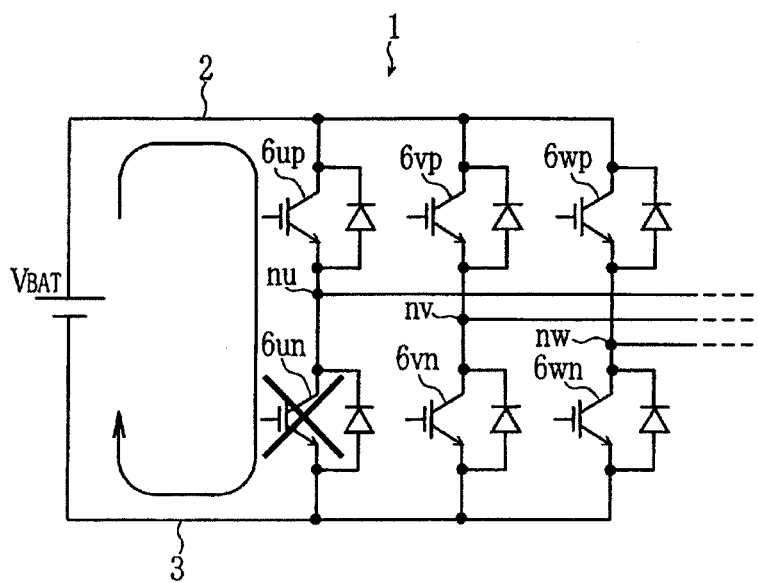
FIG. 4 is a diagram illustrating an example of a short circuit path in a case of a short circuit in upper and lower arms.

FIG. 4 is a diagram illustrating an example of a short circuit current path (short circuit path) when a short fault has occurred in the upper and lower arms. In this case, when the IGBT 6*un* is in a short circuit condition and when the IGBT 6*up* is turned on, a short circuit current flows in a path shown by an arrow in FIG. 4. For example, it is concerned that this short circuit condition of the IGBT 6*un* is caused by a fault of the transistor of the IGBT 6*un* or the freewheel diode, a fault of the gate drive circuit (e.g., the control unit 4), a malfunction due to noise, or the like.

Figure 5:
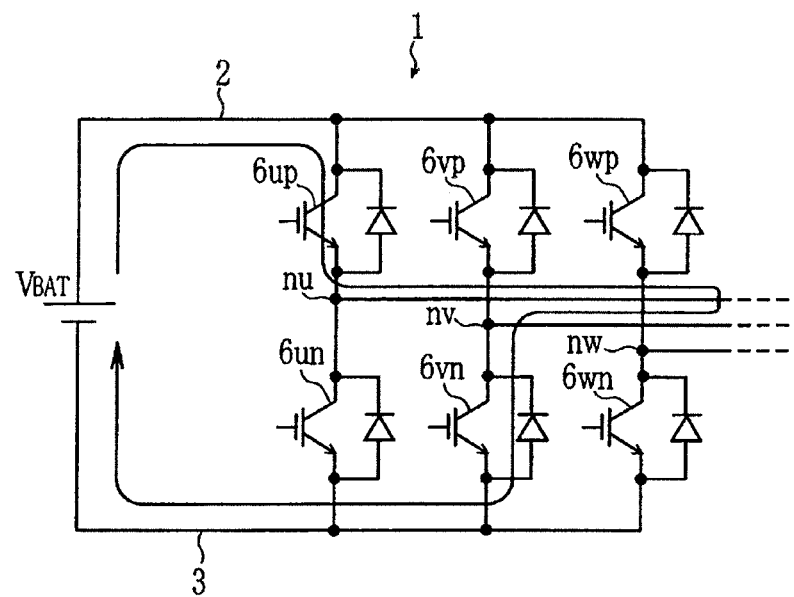
FIG. 5 is a diagram illustrating an example of a short circuit path in a case of an output short.

FIG. 5 is a diagram illustrating an example of a short circuit current path in a case of an output short circuit. When a short-circuit has occurred between the output node nu and the output node nv or between a U-phase winding and a V-phase winding of the brushless DC motor 5, and when the IGBT 6*up* and the IGBT 6*vn* are turned on, a short circuit current flows in a path shown by an arrow in FIG. 5. For example, it is concerned that this short fault is caused by an insulation breakdown of the motor winding, a human-induced error, or the like.

Figure 6:
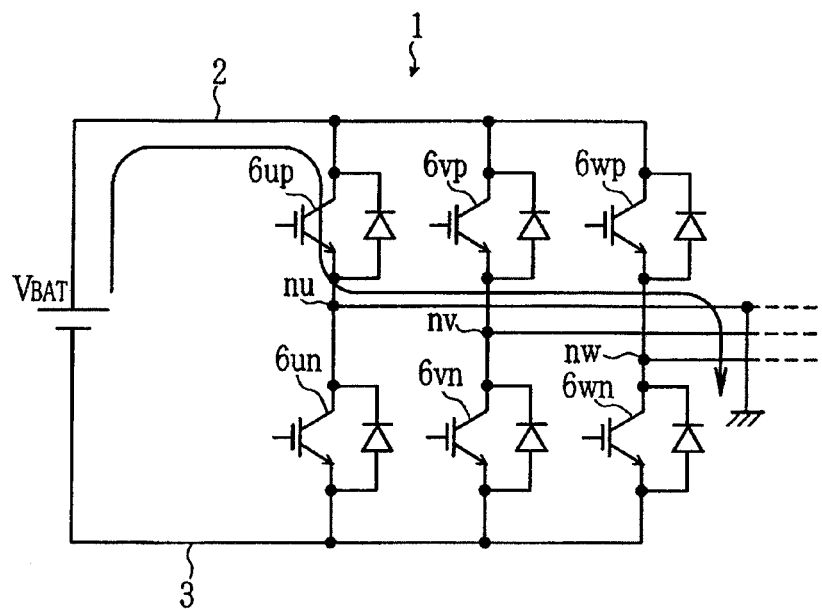
FIG. 6 is a diagram illustrating an example of a short circuit path in a case of an output grounding fault.

FIG. 6 is a diagram illustrating an example of a short circuit current path in a case of an output grounding fault. When a grounding fault has occurred in the output node nu or the U-phase winding of the brushless DC motor 5 and when the IGBT 6*up* is turned on, a short circuit current flows in a path shown by an arrow in FIG. 6. For example, it is concerned that this short fault is caused by the same reasons as described above in connection to the output short circuit shown in FIG. 5.

As described above, the path of the short circuit current is different depending on the types of faults. Further, the inductance (L component) of each path of the short circuit current will be different. Hereinafter, operations of the gate drive circuit 7 in cases of two different short faults having different inductances will be described.

Figure 7:
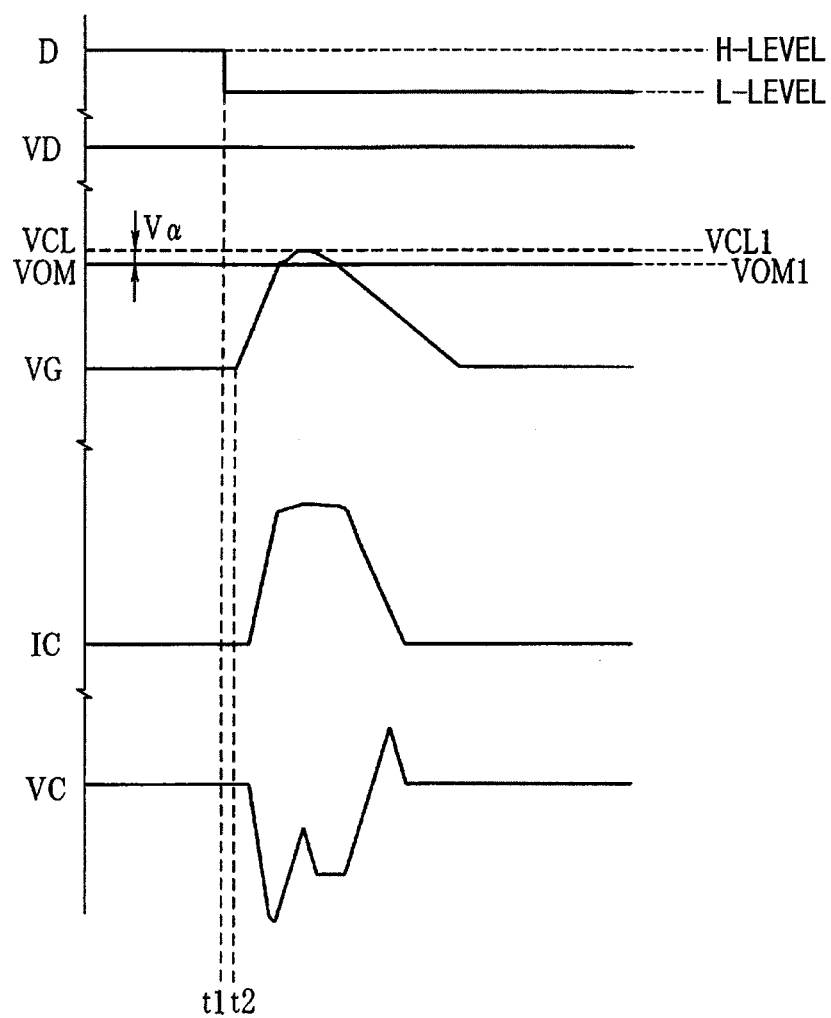
FIG. 7 is a time chart illustrating signals, voltages and currents of respective parts in a first example of a short fault.

Firstly, an operation of the gate drive circuit 7 of a first case will be described with reference to FIG. 7. In the first case, a short circuit fault has occurred, and the inductance of the short circuit path is relatively small. In FIG. 7, waveforms of the control signal D, the power source voltage VD, the drive voltage VOM, the gate drive voltage VG, the collector current IC of the IGBT 6, and the collector voltage VC of the IGBT 6 are illustrated with solid lines. A waveform of the limiting voltage VOL in the clamping operation of the gate clamp circuit 34 is illustrated with a dashed line.

In this case, since the inductance of the short circuit path is small, the collector current of the IGBT 6 drastically increases. Therefore, in the first period T1, the collector current exceeds the fault determination reference value. With this, the control unit 4 determines the short fault, and the IGBT 6 is moderately turned off. However, there is a possibility that the peak value of the short circuit current cannot be reduced until the time the IGBT 6 actually begins to turn off, due to the delay in accordance with the operation of the circuit for performing the short fault detection.

In this case, further, electric charge is injected to the gate capacitance, that is, a mirror current flows, in accordance with the change of the collector voltage of the IGBT 6. Therefore, the gate voltage VG increases over the first set value VOM1 of the drive voltage VOM. In this case, the on state of the IGBT 6 is further deepened, and there is a fear that the collector current further increases.

In the present embodiment, however, the gate voltage VG is limited to a value equal to or lower than the first limiting value Val by the clamping operation of the gate clamp circuit 34 in the first period T1. Therefore, in the first period T1, and in a period from the time the short fault is detected to the time the IGBT 6 is actually turned off, rising of the gate voltage VG due to the mirror current is restricted. As a result, the peak value of the short circuit current can be reduced to a lower value.

Figure 8:
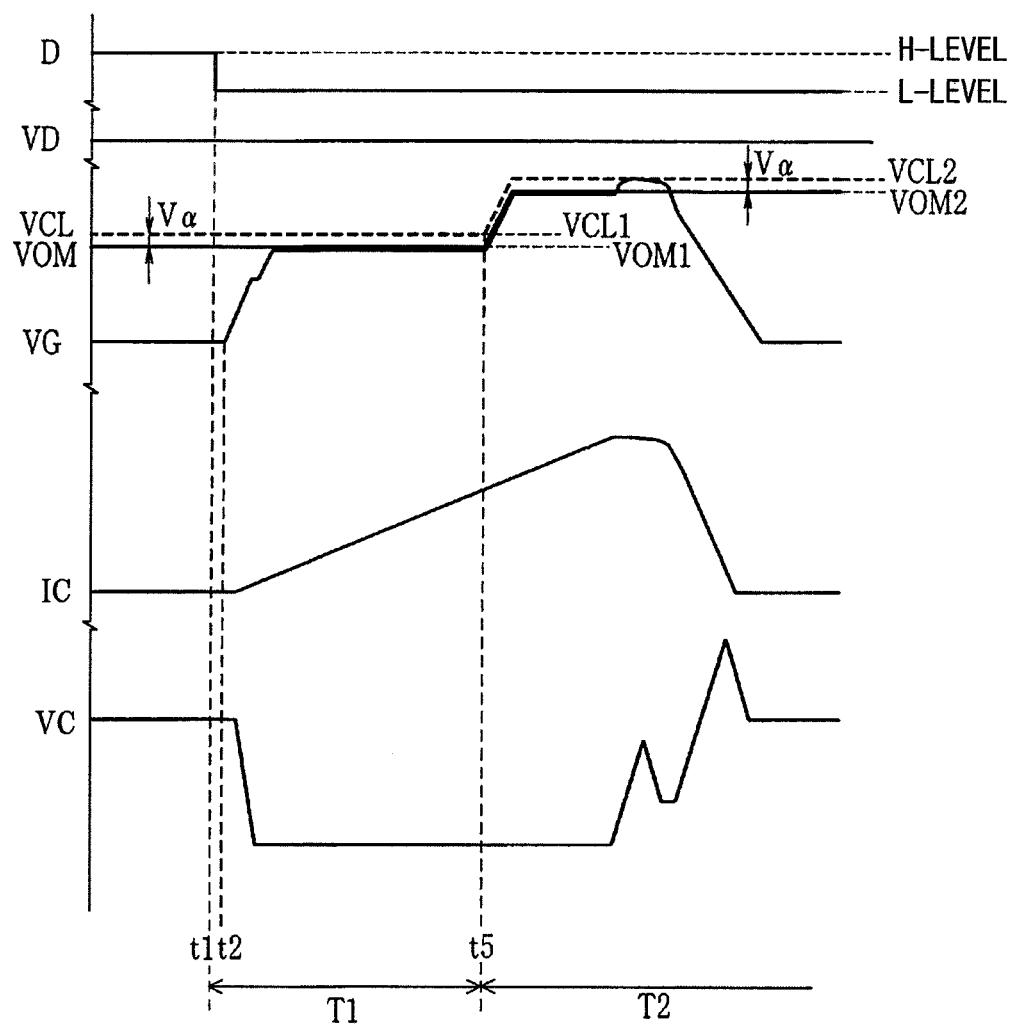
FIG. 8 is a time chart illustrating signals, voltages and currents of respective parts in a second example of a short fault.

Next, an operation of the gate drive circuit 7 in a second case will be described with reference to FIG. 8. In the second case, the short fault has occurred, and the inductance of the short circuit path is relatively large. In FIG. 8, the control signal D, the power source voltage VD, the drive voltage VOM, the gate voltage VG, the collector current IC of the IGBT 6, and the collector voltage VC of the IGBT 6 are illustrated with solid lines. The limiting voltage VCL in the clamping operation of the gate clamp circuit 34 is illustrated with a dashed line.

In this case, since the inductance of the short circuit path is large, the collector current of the IGBT 6 moderately rises. Therefore, the collector current does not exceed the fault determination reference value in the first period T1, but exceeds the fault determination reference value in the second period T2. As such, in the second period T2, the control unit 4 detects the short fault, and the IGBT 6 is moderately turned off. However, there is a possibility that the peak value of the short circuit current cannot be reduced until the time the IGBT 6 actually beings to turn off, due to the delay in accordance with the operation of the circuit for performing the short fault detection.

In this case, further, electric charge is injected to the gate capacitance, that is, a mirror current flows, in accordance with the change of the collector voltage of the IGBT 6. Therefore, the gate voltage VG increases over the second set value VOM2 of the drive voltage VOM. With this, the on state of the IGBT 6 is further deepened, and there is a fear that the collector current further increases.

In the present embodiment, however, the gate voltage VG is limited to a value lower than the second limiting value VCL2 by the clamping operation of the gate clamp circuit 34 in the second period T2. Therefore, in the second period T2, and in a period from the time the short fault is detected to the time the IGBT 6 is actually turned off, rising of the gate voltage VG due to the mirror current is restricted. As a result, the peak value of the short circuit current can be reduced to a lower value.

As described above, in the gate drive circuit 7 of the present embodiment, when a short fault has occurred, the rising of the gate voltage VG due to the mirror current is restricted by the clamping operation of the gate clamp circuit 34. In particular, in the first period T1, the gate voltage VG is limited to a value equal to or lower than the first limiting value VCL1 by the clamping operation of the gate clamp circuit 34. In the second period T2, the gate voltage VG is limited to a value equal to or lower than the second limiting value VCL2 by the clamping operation of the gate clamp circuit 34.

Therefore, irrespective of the value of the inductance (L component) of the path of the short circuit current, the rising of the gate voltage VG due to the mirror current is restricted. As a result, the peak value of the short circuit current can be reduced.

In the abnormal-time, such as in a short fault condition, the transistor 30 of the abnormal-time off circuit 25 of the gate off-drive circuit 13 is turned on. Therefore, the gate capacitance is discharged by the time constant that is determined by the resistor 31 having a relatively high resistance value. As such, the IGBT 6 is moderately turned off under a condition that a change ratio (di/dt) of the collector current (short circuit current) is reduced to a lower value. Accordingly, it is less likely that a surge exceeding the withstand voltage of the IGBT 6 will occur.

In the first period T1, the gate voltage generation circuit 11 generates the drive voltage VOM having the first set value VOM1. Therefore, in the normal operation time, a maximum value of the gate voltage VG in the first period T1 is the first set value VOM1. On the other hand, the gate clamp circuit 34 performs the clamping operation to limit the gate voltage VG equal to or lower than the first limiting value (first limiting voltage) VCL1, when the gate voltage VG of the IGBT 6 exceeds the first limiting value VCL1 which is higher than the first set value VOM1 by the voltage Vα, in the first period T1.

In the second period 12, the gate voltage generation circuit 11 generates the drive voltage VOM having the second set value VOM2. Therefore, in the normal operation time, a maximum value of the gate voltage VG of the second period T2 is the second set value VOM2. On the other hand, the gate clamp circuit 34 performs the clamping operation to limit the gate voltage VG to equal to or lower than the second limiting value (second limiting voltage) VCL2, when the gate voltage VG exceeds the second limiting value VCL2, which is higher than the second set value VOM2 by the voltage Vα, in the second period T2.

Therefore, in the normal operation time, the gate clamp circuit 34 does not perform the clamping operation in the first period T1 and the second period T2. In other words, the gate clamp circuit 34 performs the clamping operation only in the abnormal time where a short fault or the like has occurred.

Accordingly, in the present embodiment, an increase in consumption current is reduced, as compared with a structure in which the gate clamp circuit 34 is operated all of the time in the on period of the IGBT 6. Further, the short circuit protection can be performed in the entirety of the on period of the IGBT 6.

Second Embodiment

A second embodiment of the present disclosure will be described with reference to FIG. 9.

Figure 9:
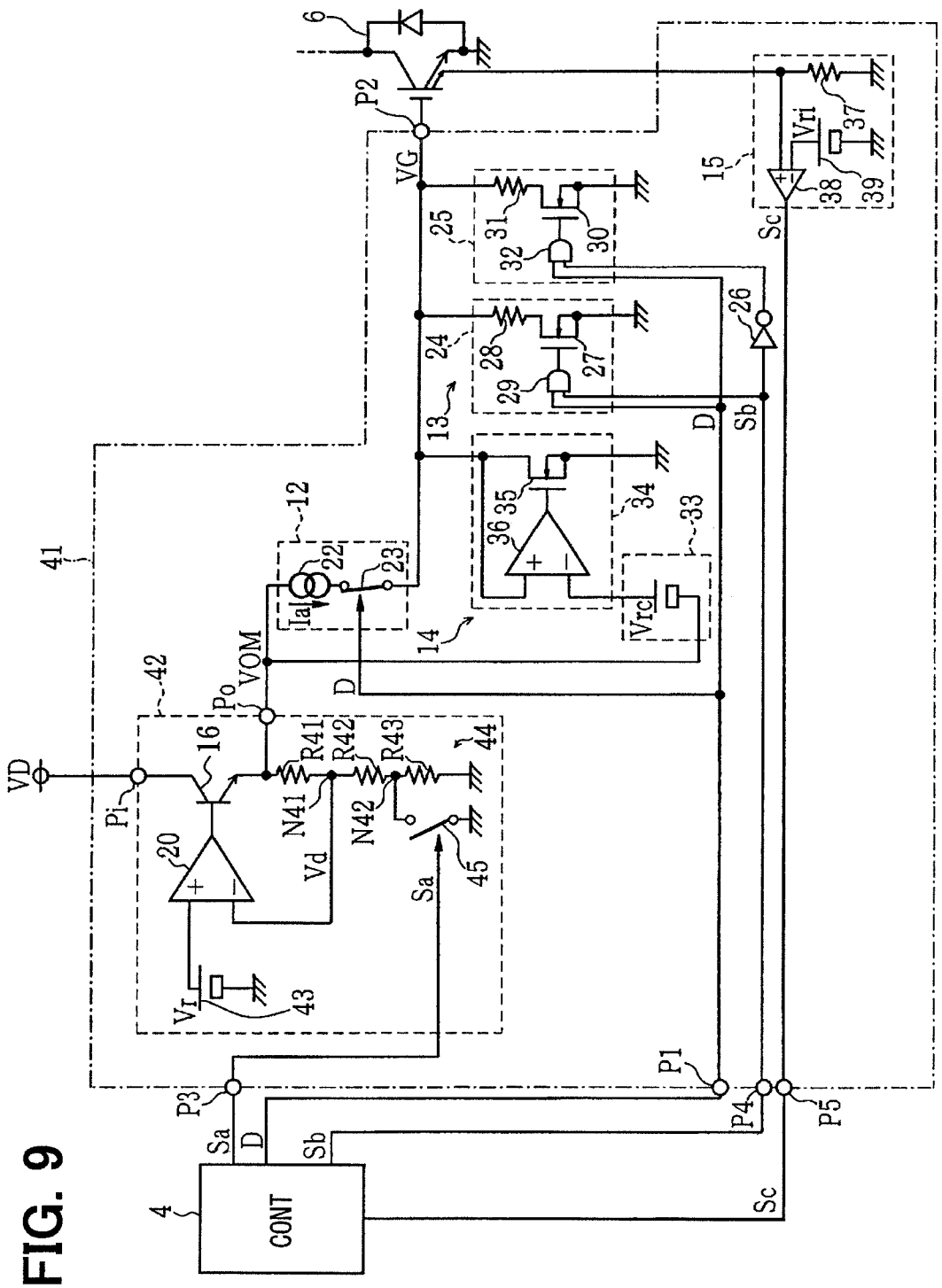
FIG. 9 is a diagram of a gate drive circuit according to a second embodiment.

As shown in FIG. 9, a gate drive circuit 41 of the second embodiment is different from the gate drive circuit 7 of the first embodiment as the gate drive circuit 41 has a gate voltage generation circuit 42, in place of the gate voltage generation circuit 11.

The gate voltage generation circuit 42 includes the transistor 16, the operation amplifier 20, a reference voltage generation part 43 and a voltage detection circuit 44. The reference voltage generation part 43 generates a reference voltage Vr for instructing a target value of the drive voltage VOM. The reference voltage Vr generated by the reference voltage generation part 43 is applied to a non-inverted input terminal of the operation amplifier 20.

The voltage detection circuit 44 includes a series circuit of resistors R41, R42, and R43, and a switch 45. The series circuit is connected between the output terminal Po and the ground line. A voltage at a common connecting point N41 between the resistor R41 and the resistor R42 is applied to an inverted input terminal of the operation amplifier 20. The switch 45 is connected between a common connecting point N42, which is between the resistor R42 and the resistor R43, and the ground line.

The switch 45 is controlled according to the level of the voltage switching signal Sa provided from the control unit 4. In particular, the switch 45 is turned of when the voltage switching signal Sa is at the high level. As such, a detection voltage Vd, which is obtained by dividing the drive voltage VOM by a series resultant resistance of the resistor R41, the resistor R42 and the resistor R43, is applied to the inverted input terminal of the operation amplifier 20. The switch 45 is turned on when the voltage switching signal Sa is at the low level. As such, a detection voltage Vd, which is obtained by dividing the drive voltage VOM by a series resultant resistance of the resistor R41 and the resistor R42, is applied to the inverted input terminal of the operation amplifier 20.

A resistance ratio (division ratio) of the resistor R41, the resistor R42 and the resistor R43 is set to a value so that the detection voltage Vd, when the switch 45 is in an off state and the drive voltage VOM is at the first set value VOM1, coincides with the reference voltage Vr, and the detection voltage Vd, when the switch 45 is in an on state and the drive voltage VOM is at the second set value VOM2, coincides with the reference voltage Vr.

In the gate voltage generation circuit 11 of the first embodiment, the drive voltage VOM is switched between the first set value VOM1 and the second set value VOM2 by switching the reference voltage of the series regulator power source circuit between two levels. In the gate voltage generation circuit 42 of the present embodiment, on the other hand, the drive voltage VOM is switched to the first set value VOM1 or the second set value VOM2 by switching the gain of the detection voltage (feedback voltage) of the series regulator power source circuit between two levels. Also in this structure, advantageous effects similar to the first embodiment can be achieved.

Third Embodiment

A third embodiment of the present disclosure will be described with reference to FIG. 10.

Figure 10:
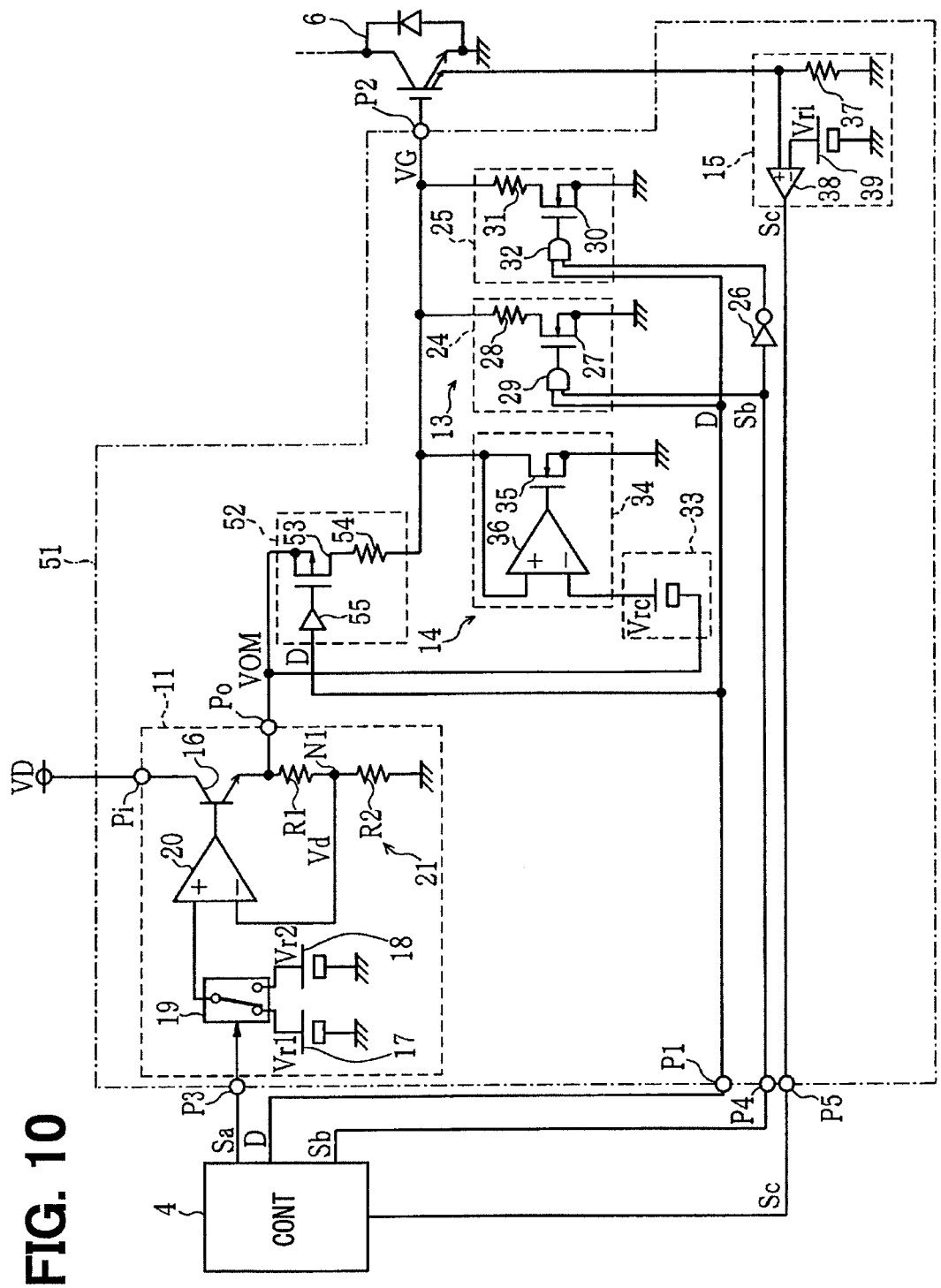
FIG. 10 is a diagram of a gate drive circuit according to a third embodiment.

As shown in FIG. 10, a gate drive circuit 51 of the third embodiment is different from the gate drive circuit 7 of the first embodiment as the gate drive circuit 51 has a gate on-drive circuit 52, in place of the gate on-drive circuit 12.

The gate on-drive circuit 52 includes a transistor 53, a resistor 54 and a buffer circuit 55. The transistor 53 is a P-channel MOS transistor. A source of the transistor 53 is connected to the output terminal Po of the gate voltage generation circuit 11, and a drain of the transistor 53 is connected to the gate of the IGBT 6 through the resistor 54. The control signal D is applied to the gate of the transistor 53 through the buffer circuit 55. When the control signal D is at the high level, the transistor 53 is turned off. When the control signal D is at the low level, the transistor 53 is turned on.

In the above-described structure, when the control signal D is at the low level, that is, when the on command is inputted to, the gate on-drive circuit 52 electrically connect, that is, turns on a voltage supply path from the output terminal Po to the gate of the IGBT 6. With this, the gate capacitance is charged by the current determined by the drive voltage VOM, the gate voltage VG and the resistance value of the resistor 54, and the gate voltage VG rises. Thus, the IGBT 6 is turned on. That is, the gate drive circuit 51 turns on the IGBT 6 by driving the gate of the IGBT 6 with the constant voltage (i.e., constant voltage drive). Also in this structure, the advantageous effects similar to the first embodiment can be achieved.

Fourth Embodiment

A fourth embodiment of the present disclosure will be described with reference to FIG. 11.

Figure 11:
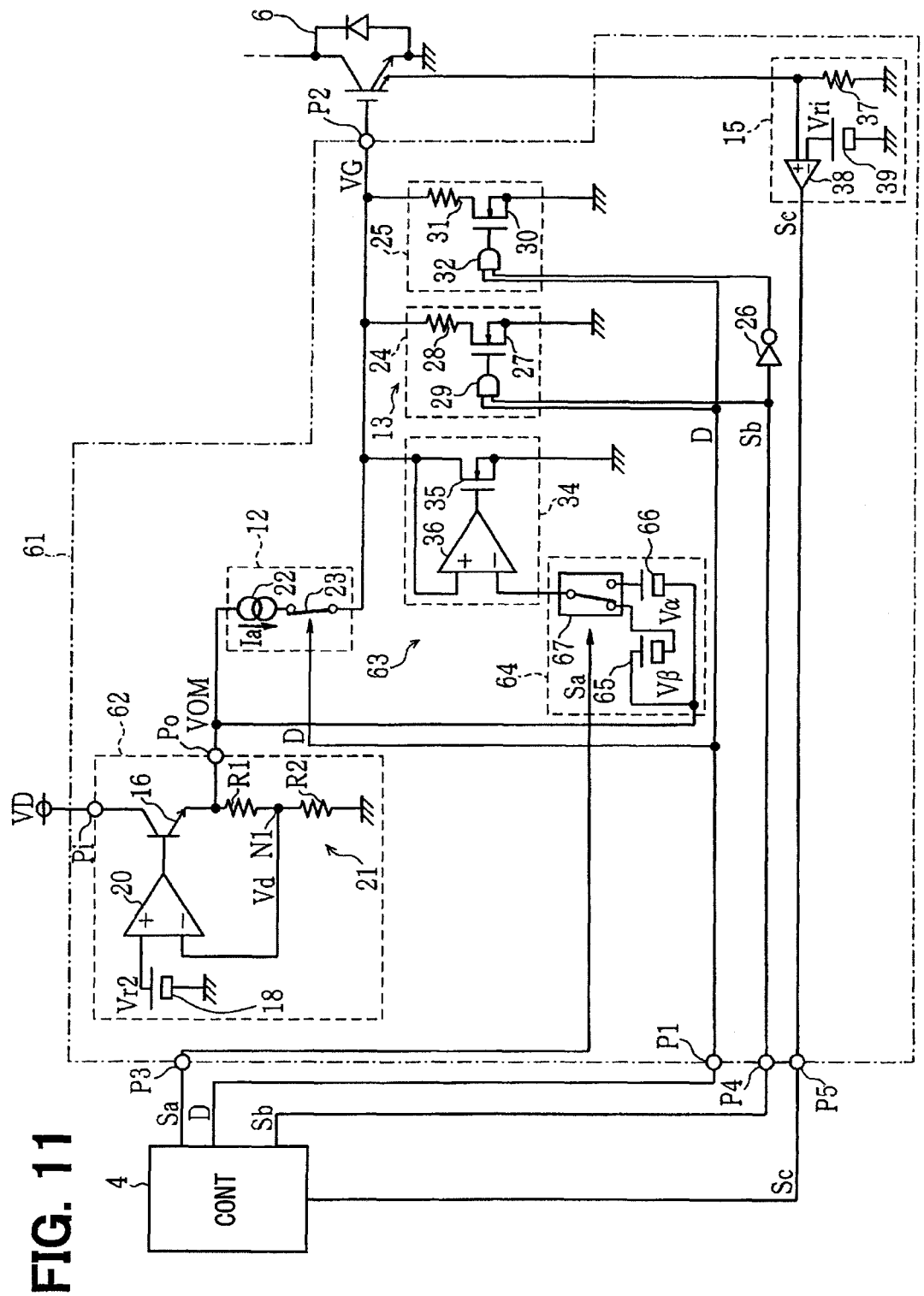
FIG. 11 is a diagram of a gate drive circuit according to a fourth embodiment.

As shown in FIG. 11, a gate drive circuit 61 of the fourth embodiment is different from the gate drive circuit 7 of the first embodiment as the gate drive circuit 61 has a gate voltage generation circuit 62 and a gate voltage limiting circuit 63, respectively, in place of the gate voltage generation circuit 11 and the gate voltage limiting circuit 14.

The gate voltage generation circuit 62 outputs the drive voltage VOM having the second set value VOM2. The gate voltage generation circuit 62 does not have a function of switching the value of the drive voltage VOM outputted from the gate voltage generation circuit 62. The gate voltage generation circuit 62 includes the transistor 16, the reference voltage generation part 18, the operation amplifier 20 and the voltage detection circuit 21.

The reference voltage generation part 18 generates a second reference voltage Vr2 for instructing the second set value VOM2 as a target value of the drive voltage VOM. The second reference voltage Vr2 outputted from the reference voltage generation part 18 is applied to the non-inverted input terminal of the operation amplifier 20.

The resistance ratio (voltage division ratio) of the resistor R1 and the resistor R2 of the voltage detection circuit 21 is set to a value so that the detection voltage Vd coincides with the second reference voltage Vr2 when the drive voltage VOM has the second set value VOM2.

The gate voltage limiting circuit 63 includes a gate clamp circuit 34 and a clamp circuit reference voltage generation part 64. The clamp circuit reference voltage generation part 64 corresponds to a limiting voltage generation circuit.

The clamp circuit reference voltage generation part 64 includes constant voltage circuits 65, 66 and a switch 67. The constant voltage circuit 65 generates a voltage vp based on the drive voltage VOM as a reference. The drive voltage VOM is applied to a high potential-side terminal of the constant voltage circuit 65. A voltage of a low potential-side terminal of the constant voltage circuit 65 is applied to a first terminal of the switch 67.

The constant voltage circuit 66 generates the voltage Vα based on the drive voltage VOM as a reference. The drive voltage VOM is applied to a low potential-side terminal of the constant voltage circuit 66. A voltage of a high potential-side terminal of the constant voltage circuit 66 is applied to a second terminal of the switching terminals of the switch 67. A common terminal of the switch 67 is connected to an inverted input terminal of an operation amplifier 36 of the gate clamp circuit 34, as an output terminal of the reference voltage Vrc.

The switch 67 is controlled in accordance with the level of the voltage switching signal Sa provided from the control unit 4. In particular, when the voltage switching signal Sa is at the high level, the switch 67 is switched so as to electrically connect between the first terminal and the common terminal. With this, the reference voltage Vrc that is lower than the drive voltage VOM by the voltage Vβ is applied to the inverted input terminal of the operation amplifier 36. In the present embodiment, the voltage Vβ generated by the constant voltage circuit 65 is set to a value so that the reference voltage Vrc (i.e., Vrc=VOM2−Vβ) in this time coincides with the first limiting value Val of the first embodiment.

When the voltage switching signal Sa is at the low level, the switch 67 is switched so as to electrically connect between the second terminal and the common terminal. With this, the reference voltage Vrc obtained by adding the voltage Vα to the drive voltage VOM is applied to the inverted input terminal of the operation amplifier 36.

Also in this structure, the first limiting value VCL1 and the second limiting value VCL2 of the clamping operation of the gate clamp circuit 34 are the same values as those of the first embodiment. Therefore, also in the present embodiment, the advantageous effects similar to the first embodiment can be achieved.

In the above-described structure, however, the gate voltage generation circuit 62 does not have the function of switching the value of the drive voltage VOM, and always generates the drive voltage VOM having the second set value VOM2. That is, the value of the drive voltage VOM generated by the gate voltage generation circuit 62 is the second set value VOM2 throughout the first period T1 and the second period T2. Therefore, even in the normal operation time, the gate voltage VG tries to increase over the first limiting value VCL1 in the period after the mirror period (timing t4) to the end of the first period T1 (timing t5).

Therefore, in the normal operation time, the clamping operation by the gate clamp circuit 34 is performed at a final stage of the first period T1. That is, even in the normal operation time, the gate voltage VG is limited by the clamping operation of the gate clamp circuit 34 in the first period T1. In the structure of the present embodiment, the consumption current will increase by the amount for operating the gate clamp circuit 34 in the period from the timing t4 to the timing t5 in the normal operation time. However, in the first period T1, the gate voltage VG can be limited at higher accuracy.

Other Embodiments

The present disclosure is not limited to the embodiments described above and illustrated in the drawings, but may be modified or expanded in various ways.

For example, the target of drive by the gate drive circuit, that is, the target transistor may not be limited to the IGBT, but may be a voltage driven semiconductor device (transistor), such as MOS transistor.

The gate voltage generation circuits 11, 42, 62 are not limited to have the structures shown in FIGS. 2, 9 and 11, but may have any other structures as long as it have the similar functions. In the above-described embodiments, the gate voltage generation circuits 11, 42, 62 are series regulator-type power supply circuits. Alternatively, the gate voltage generation circuits 11, 42, 62 may be switching regulator-type power supply circuits. The transistor 16 may be modified to a PNP bipolar transistor, a MOS transistor or the like.

The gate on-drive circuit 52 may not be limited to have the structure shown in FIG. 10. The gate on-drive circuit 52 may have any other circuit structure as long as it has the similar functions. For example, the transistor 53 may be modified to an N-channel MOS transistor, a bipolar transistor, or the like.

The gate clamp circuit 34 may not be limited to have the structures shown in FIGS. 2, 9, 10 and 11. The gate clamp circuit 34 may have any other circuit structure as long as it has the similar functions. For example, the transistor 35 may be modified to an NPN bipolar transistor.

The gate off-drive circuit 13 may not be limited to have the structures shown in FIGS. 2, 9, 10 and 11. The gate off-drive circuit 13 may have any other circuit structure as long as it has the similar functions. For example, the transistor 27, 30 may be modified to an NPN bipolar transistor.

The overcurrent determination circuit 15 may not be limited to have the structures shown in FIGS. 2, 9, 10, and 11. The overcurrent determination circuit 15 may have any other circuit structures as long as it has the similar functions.

Summarizing the above, a gate drive circuit 7 includes a drive voltage generation circuit 11, 42, 62, a gate on-drive circuit 12, 52, and a gate voltage limiting circuit 14, 63. The gate voltage generation circuit 11, 42, 62 generates a drive voltage VOM to drive a target transistor 6, 6*up*, 6*vp*, 6*wp*, 6*un*, 6*vn*, 6*wn*. The gate on-drive circuit 12, 52 turns on a voltage supply path from an output terminal of the drive voltage generation circuit 11, 42, 62 to a gate terminal of the target transistor 6, 6*up*, 6*vp*, 6*wp*, 6*un*, 6*vn*, 6*wn* according to an on command, and turns off the voltage supply path according to an off command. The gate voltage limiting circuit 14, 63 limits a gate voltage of the target transistor 6, 6*up*, 6*vp*, 6*wp*, 6*un*, 6*vn*, 6*wn* equal to or lower than a first limiting voltage VCL1, irrespective of a voltage applied to the target transistor, in a first period T1 from a time the on command is generated to a time determination whether a current flowing in the target transistor exceeds a fault determination reference value finishes, and limits the gate voltage equal to or lower than a second limiting voltage VCL2 that is higher than the first limiting voltage VCL1, irrespective of the voltage applied to the transistor, in a second period T2 after the first period T1. The first limiting voltage VCL1 is determined to a value so that a current flowing in the target transistor is kept equal to or lower than a maximum allowable current. In the second period T2, the drive voltage generation circuit 11, 42, 62 generates the drive voltage having a second set value VOM2 that is determined based on a gate withstand voltage of the target transistor 6, 6*up*, 6*vp*, 6*wp*, 6*un*, 6*vn*, 6*wn* and loss of the target transistor 6, 6*up*, 6*vp*, 6*wp*, 6*un*, 6*vn*, 6*wn* when the target transistor 6, 6*up*, 6*vp*, 6*wp*, 6*un*, 6*vn*, 6*wn* is operated in a saturated region. The second limiting voltage VCL2 is set to a value higher than the second set value VOM2 of the drive voltage by a predetermined value.

In the gate drive circuit 7, the drive voltage generation circuit 11, 42 may generate the drive voltage VOM having a first set value VOM1 that is higher than a threshold voltage of the target transistor 6, 6*up*, 6*vp*, 6*wp*, 6*un*, 6*vn*, 6*wn* and lower than the second set value VOM2. The first limiting voltage VCL1 may be set to a value that is higher than the first set value VOM1 of the drive voltage VOM by a predetermined value.

While only the selected exemplary embodiment and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

What is claimed is:

1. A gate drive circuit for a target transistor, comprising:
a drive voltage generation circuit that generates a drive voltage to drive the target transistor;
a gate on-drive circuit that turns on a voltage supply path from an output terminal of the drive voltage generation circuit to a gate terminal of the target transistor according to an on command, and turns off the voltage supply path according to an off command; and
a gate voltage limiting circuit that limits a gate voltage of the target transistor as equal to or lower than a first limiting voltage, irrespective of a voltage applied to the target transistor, in a first period from a time the on command is generated to a time determination whether a current flowing in the target transistor exceeds a fault determination reference value finishes, and limits the gate voltage as equal to or lower than a second limiting voltage that is higher than the first limiting voltage, irrespective of the voltage applied to the target transistor, in a second period after the first period, the first limiting voltage being determined to a value so that a current flowing in the target transistor is kept equal to or lower than a maximum allowable current,
wherein in the second period, the drive voltage generation circuit generates the drive voltage having a second set value that is determined based on a gate withstand voltage of the target transistor and loss of the target transistor when the target transistor is operated in a saturated region,
wherein the second limiting voltage is set to a value higher than the second set value of the drive voltage by a predetermined value, and
wherein the gate voltage limiting circuit includes;
a voltage limiting transistor is connected between the gate terminal of the target transistor and a ground line;
a limiting voltage generation circuit includes a constant voltage circuit and generates the second limiting voltage based on the drive voltage; and
a voltage limiting operation control circuit compares an output voltage of the limiting voltage generation circuit and the gate voltage of the target transistor, and turns on the voltage limiting transistor when the gate voltage is equal to or higher than the output voltage of the limiting voltage generation circuit.

2. The gate drive circuit according to claim 1, wherein
in the first period, the drive voltage generation circuit generates the drive voltage having a first set value that is higher than a threshold voltage of the target transistor and lower than the second set value, and
the first limiting voltage is set to a value that is higher than the first set value of the drive voltage by a predetermined value.

3. The gate drive circuit according to claim 2, wherein
the drive voltage generation circuit is provided by a regulator power supply circuit that switches the drive voltage between the first set value and the second set value by switching a reference voltage between two levels.

4. The gate drive circuit according to claim 2, wherein
the drive voltage generation circuit is provided by a regulator power supply circuit that switches the drive voltage between the first set value and the second set value by switching a gain of a feedback voltage between two levels.

5. The gate drive circuit according to claim 2, wherein
the limiting voltage generation circuit generates the first limiting voltage based on the drive voltage.

6. The gate drive circuit according to claim 1, wherein
the drive voltage generation circuit generates the drive voltage having the second set value in the first period and the second period.

7. The gate drive circuit according to claim 1, further comprising
a gate off-drive circuit that discharges a gate capacitance of the target transistor according to the off command, wherein
the gate off-drive circuit discharges the gate capacitance through a first path when the off command is generated in a normal time, and
the gate off-drive circuit discharges the gate capacitance through a second path having a resistance value higher than that of the first path when the off command is generated in a condition where it is determined that the current flowing in the target transistor exceeds the fault determination reference value.

* * * * *